United States Patent
Ito et al.

(10) Patent No.: US 10,403,841 B2
(45) Date of Patent: Sep. 3, 2019

(54) ORGANIC ELECTROLUMINESCENT ELEMENT AND ORGANIC ELECTROLUMINESCENT DISPLAY DEVICE

(71) Applicant: Sharp Kabushiki Kaisha, Sakai, Osaka (JP)

(72) Inventors: Asae Ito, Sakai (JP); Yuto Tsukamoto, Sakai (JP); Manabu Niboshi, Sakai (JP); Eiji Koike, Sakai (JP); Shinichi Kawato, Sakai (JP); Katsuhiro Kikuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/776,798

(22) PCT Filed: Feb. 9, 2017

(86) PCT No.: PCT/JP2017/004729
§ 371 (c)(1),
(2) Date: May 17, 2018

(87) PCT Pub. No.: WO2017/138607
PCT Pub. Date: Aug. 17, 2017

(65) Prior Publication Data
US 2018/0375050 A1    Dec. 27, 2018

(30) Foreign Application Priority Data
Feb. 10, 2016  (JP) .................................. 2016-024108

(51) Int. Cl.
*H01L 51/50*    (2006.01)
*H01L 51/52*    (2006.01)

(52) U.S. Cl.
CPC ...... *H01L 51/5028* (2013.01); *H01L 51/5016* (2013.01); *H01L 51/5036* (2013.01);
(Continued)

(58) Field of Classification Search
CPC ............. H01L 51/5028; H01L 51/5206; H01L 51/5036; H01L 51/5056; H01L 51/5072;
(Continued)

(56) References Cited

U.S. PATENT DOCUMENTS

| | | | |
|---|---|---|---|
| 2006/0125380 A1* | 6/2006 | Nagara | ............... H01L 51/5016 313/504 |
| 2015/0115245 A1* | 4/2015 | Archer | ................ H01L 51/5028 257/40 |

FOREIGN PATENT DOCUMENTS

JP    2015-185728 A    10/2015

OTHER PUBLICATIONS

Mahato et al., "Fast and long-range triplet exciton diffusion in metal—organic frameworks for photon upconversion at ultralow excitation power", Nature Materials, Advance Online Publication, DOI: 10.1038/nmat 4366, Aug. 3, 2015, 24 pages.

\* cited by examiner

*Primary Examiner* — Julia Slutsker
(74) *Attorney, Agent, or Firm* — Keating & Bennett, LLP

(57) ABSTRACT

An organic EL element is provided that has a high light emission efficiency and that emits a plurality of light beams having respective wavelength ranges different from one another, the light beams including short wavelength light having a high chromaticity. An organic EL element (1) includes an exciton generating layer (7) and a guest layer (8) that are adjacent to each other.

20 Claims, 7 Drawing Sheets

(52) U.S. Cl.
CPC ...... *H01L 51/5056* (2013.01); *H01L 51/5072* (2013.01); *H01L 51/5206* (2013.01); *H01L 51/5221* (2013.01); *H01L 2251/533* (2013.01); *H01L 2251/5315* (2013.01); *H01L 2251/5376* (2013.01); *H01L 2251/558* (2013.01)

(58) Field of Classification Search
CPC . H01L 51/5016; H01L 51/5221; H01L 51/50; H01L 2251/5376
See application file for complete search history.

Light emission

ORGANIC ELECTROLUMINESCENT ELEMENT AND ORGANIC ELECTROLUMINESCENT DISPLAY DEVICE

TECHNICAL FIELD

The disclosure relates to an organic electroluminescent element and an organic electroluminescent display device.

BACKGROUND ART

In recent years, various flat-panel displays have been developed. Organic electroluminescent display devices (hereinafter referred to as "organic EL display device") including an organic electroluminescent element (hereinafter referred to as "organic EL element"), especially, are attracting much attention as excellent flat-panel displays as these devices can achieve power saving, thickness reduction, improved image quality, and the like.

The organic EL element included in an organic EL display device has a configuration in which a luminescent layer containing a luminescent material made of an organic compound is sandwiched between a cathode and an anode. The organic EL element emits light by utilizing a mechanism in which electrons and positive holes (holes) are introduced into the luminescent layer, the electrons and positive holes are caused to recombine so that excitons are generated thereby, and light is emitted when the excitons lose their activity.

Such a luminescent material contains organic molecules that are excited from the ground state ($S_0$ state) to an excited state as electrons at highest occupied molecular orbital (HOMO) levels absorb energy to transition to lowest unoccupied molecular orbital (LUMO) levels.

Organic molecules have two excited states that differ from each other in spin multiplicity, namely (i) a singlet excited state ($S_1$ state), in which the respective spinning directions of electrons at HOMO levels and those at LUMO levels are antiparallel to each other, and (ii) a triplet excited state ($T_1$ state), in which the respective spinning directions of electrons at HOMO levels and those at LUMO levels are parallel to each other.

As described above, the organic EL element utilizes a mechanism in which electrons and positive holes (holes) are introduced into the luminescent layer, the electrons and positive holes are caused to recombine so that excitons are generated thereby, and light is emitted when the excitons lose their activity. Such an exciton generated has a 25% chance of having the $S_1$ state and a 75% chance of having the $T_1$ state. When the exciton transitions from the triplet excited state ($T_1$ state) to the ground state ($S_0$ state), the exciton typically emits phosphorescence over a very long light emission lifetime of not less than several milliseconds and has a rate constant for heat inactivation which rate constant is larger than the rate constant for phosphorescence emission. The exciton is known to usually undergo radiationless deactivation, that is, to emit no light and release heat, at room temperature. Thus, a typical fluorescent material is said to have an internal quantum yield with a limit of 25%.

There is currently a phosphorescent material containing, as a central metal, a heavy atom such as an iridium complex. It has been made possible for such a phosphorescent material to (i) allow excitons having a singlet state to transition to a triplet state through exchange crossing as a result of an internal heavy atom effect and thereby (ii) cause all the singlet excitons and triplet excitons to contribute to light emission.

Recent years have seen development of a thermally activated delayed-emission material (hereinafter referred to as "TADF material"), which has an extremely small energy difference between an energy level (hereinafter referred to as "$ES_1$ level") in the lowest singlet excited state ($S_1$ state) and an energy level (hereinafter referred to as "$ET_1$ level") in the lowest triplet excited state ($T_1$ state). For a material that emits blue light, in particular, there has been development of new luminescent materials having a high light emission efficiency and a short-wavelength light emission peak.

A TADF material has an extremely small energy difference $\Delta EST$ between the $ES_1$ level and the $ET_1$ level, and allows excitons in the $T_1$ state to become excitons in the $S_1$ state due to inverse intersystem crossing. A TADF material thus allows excitons to contribute to light emission at 100%.

There has recently been disclosed a technique of combining a phosphorescent material such as the above with a fluorescent material to transfer energy to a target component for light emission by that component, thereby allowing a light-emitting element to have a longer life and a higher light emission efficiency.

Patent Literature 1, for example, discloses an organic EL element including (i) a first light-emitting layer containing at least one phosphorescence emitter and (ii) a second light-emitting layer adjacent to the first light-emitting layer and containing a fluorescence emitter that emits light mainly within a spectral range on the shorter wavelength side of the light emission peak of the first light-emitting layer. The fluorescence emitter of the second light-emitting layer is a substance having delayed fluorescence as a result of (i) energy transfer of triplet excitons from at least one phosphorescence emitter in the first light-emitting layer and (ii) upconversion from the triplet excited state to the singlet excited state. This makes it possible to provide an organic EL light-emitting device that is capable of emitting a plurality of colors of light including white light and that has a longer life.

Non-Patent Literature 1 discloses a light emission mechanism that involves a crystalline material having a metal-organic framework (MOF) and containing acceptor molecules self-organized in a regular pattern and that enables photon upconversion in a solid having a MOF.

CITATION LIST

Patent Literature

[Patent Literature 1]
Japanese Patent Application Publication, Tokukai, No. 2015-185728 (Publication Date: Oct. 22, 2015)

Non-Patent Literature

[Non-Patent Literature 1]
Prasenjit Mahato et al., "Fast and long-range triplet exciton diffusion in metal-organic frameworks for photon upconversion at ultralow excitation power", nature materials, ADVANCE ONLINE PUBLICATION, pp. 1 to 8 (3 Aug. 2015)

SUMMARY

Technical Problem

Patent Literature 1 does not particularly discuss, for example, an appropriate thickness of each light-emitting layer. The technique of Patent Literature 1 may suffer from the issue of triplet excitons in the first light-emitting layer undergoing (i) inefficient energy transfer to the second light-emitting layer and (ii) triplet-triplet annihilation (TTA) in the first light-emitting layer to be deactivated. The technique of Patent Literature 1 also involves such issues as (i) only the phosphorescent material in the first light-emitting layer emitting light or (ii) the luminescent material in the second light-emitting layer directly receiving an injected carrier to emit light, with the result of a significantly decreased light emission efficiency. Further, the technique disclosed in Patent Literature 1 is directed particularly to an organic EL element configured to emit white light, and does not disclose a specific method of applying the technique to organic EL elements configured to emit other colors of light.

Non-Patent Literature 1 discloses a light emission mechanism that enables photon upconversion in a solid having a metal-organic framework (MOF). Introducing such a lattice structure into an organic EL element while maintaining the uniformity of the lattice structure is, however, difficult during a continuous process. It will be problematically difficult in view of future volume production in particular to apply the mechanism to an organic EL element. Further, it is also difficult for a light emission mechanism involving such a lattice structure to convert light into multi-wavelength light.

The disclosure has been accomplished in view of the above issues. It is an object of the disclosure to provide an organic electroluminescent element having a high light emission efficiency and capable of emitting short-wavelength light having a high chromaticity.

Solution to Problem

In order to attain the above object, an organic electroluminescent element in accordance with the disclosure is an organic electroluminescent element, including: an anode; a cathode; and an organic layer between the anode and the cathode, the organic layer including (i) a first layer containing at least one phosphorescent material and (ii) a second layer containing at least one fluorescent material, at least the first layer and the second layer being adjacent to each other, an energy level in a lowest triplet excited state in the first layer being higher than an energy level in a lowest triplet excited state in the second layer, the second layer having a thickness of not more than 1 nm, the organic electroluminescent element being configured to emit light within at least one wavelength range, the light including light within a first wavelength range which light within the first wavelength range is emitted when an exciton in a lowest singlet excited state in the second layer which exciton is generated in a case where (i) a triplet exciton generated in the first layer undergoes energy transfer to an exciton in a triplet excited state in the second layer and (ii) the exciton in the triplet excited state is upconverted to an exciton in a singlet excited state among molecules in the second layer changes to a ground state.

With the above configuration, the organic layer includes (i) a first layer containing at least one phosphorescent material and (ii) a second layer containing at least one fluorescent material, at least the first layer and the second layer being adjacent to each other, an energy level in a lowest triplet excited state of molecules in the first layer being higher than an energy level in a lowest triplet excited state in the second layer. Further, the second layer having a thickness of not more than 1 nm allows for an efficient energy transfer from a triplet state of molecules in the first layer to a triplet state of molecules in the second layer. This makes it possible to provide an organic electroluminescent element having a high light emission efficiency.

With the above configuration, the upconversion from excitons in a triplet excited state that are of molecules in the second layer makes it possible to generate excitons in a singlet excited state that are of molecules in the second layer. This makes it possible to provide an organic electroluminescent element capable of emitting short-wavelength light having a high chromaticity.

Advantageous Effects of Invention

An embodiment of the disclosure makes it possible to provide an organic electroluminescent element having a high light emission efficiency and capable of emitting short-wavelength light having a high chromaticity.

DESCRIPTION OF EMBODIMENTS

The following description will discuss embodiments of the disclosure with reference to FIGS. 1 to 9. In the description below, a member for an embodiment which member is identical in function to a member described for another embodiment may be assigned the same reference sign and may not be described again for convenience.

Embodiment 1

Figure 1:
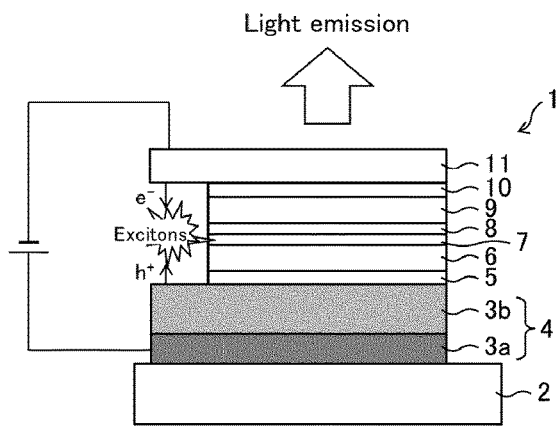
FIG. 1 is a diagram illustrating a cross section of an organic EL element in accordance with Embodiment 1, the diagram schematically illustrating a configuration of the organic EL element.
Figure 2:
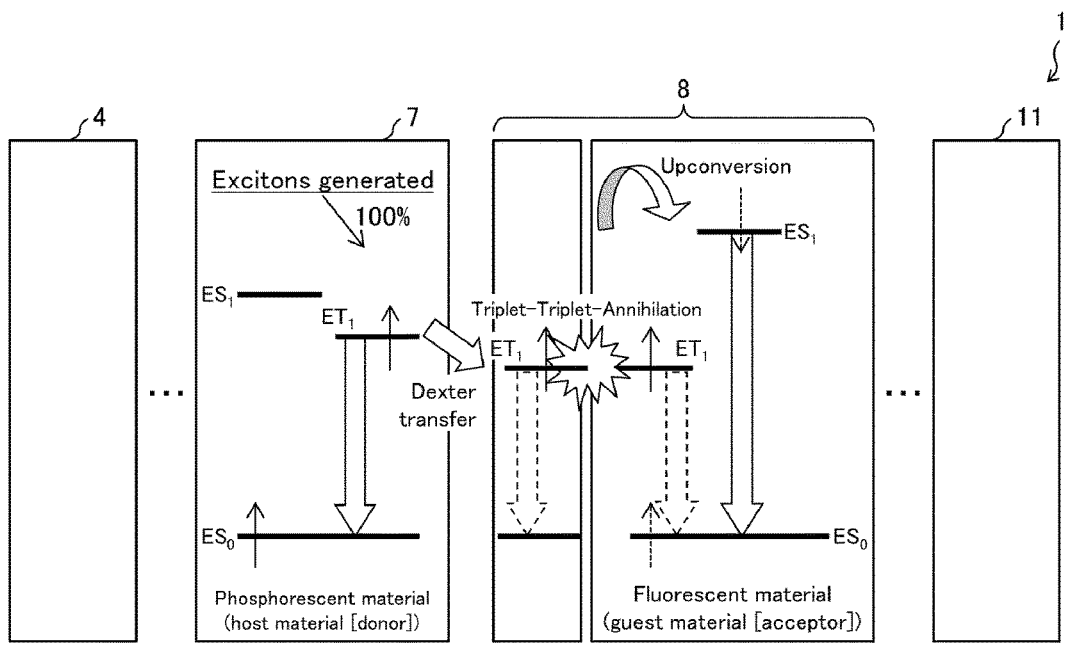
FIG. 2 is a diagram illustrating a mechanism by which the organic EL element illustrated in FIG. 1 emits light.

The following description will discuss an embodiment of the disclosure with reference to FIGS. 1 and 2.

<Schematic Configuration of Organic EL Element>

FIG. 1 is a diagram illustrating a cross section of an organic EL element 1 in accordance with the present embodiment, the diagram schematically illustrating a configuration of the organic EL element 1.

As illustrated in FIG. 1, the organic EL element 1 in accordance with the present embodiment includes a substrate 2 as a base, and also includes a stack on the substrate 2 which stack includes in sequence an anode 4, a hole injection layer 5, a hole transfer layer 6, an exciton generating layer 7 (first layer), a guest layer 8 (second layer), an electron transfer layer 9, an electron injection layer 10, and a cathode 11.

The present embodiment described here as an example is an organic EL element 1 of the top emission type, in which light emitted by the guest layer 8 is extracted from the side of the cathode 11 (which is opposite to the substrate 2).

(Substrate 2)

The substrate 2 is not limited to a particular one, provided that the substrate has an electrically insulating property. For example, it is possible to employ a publicly known electrically insulating substrate. Examples of the substrate 2 encompass an inorganic substrate containing a material such as glass or quartz, a plastic substrate containing a material such as polyethylene terephthalate or polyimide resin.

The organic EL element 1 is of the top emission type, that is, causes light emitted by the guest layer 8 to be extracted from the side of the cathode 11 (which is opposite to the substrate 2). The substrate 2 thus does not need to be light-transmitting.

Therefore, in a case where the organic EL element 1 is a top emission type organic EL element, it is possible to employ, as the substrate 2, a substrate such as (i) a semiconductor substrate such as a silicon wafer, (ii) a substrate in which a surface of a metal substrate containing aluminum (Al), iron (Fe), or the like is coated with an insulator such as a silicon oxide or an organic insulating material, or (iii) a substrate in which a surface of a metal substrate containing Al or the like has been subjected to insulating treatment by a method such as anodic oxidization.

(Anode 4)

The anode 4 only needs to have the function as an electrode for injecting positive holes $h^+$ into the exciton generating layer 7.

The anode 4 is not particularly limited in terms of shape, structure, size, and the like, and those properties can be appropriately selected in accordance with use and/or purpose of the organic EL element 1.

The organic EL element 1 is of the top emission type, that is, causes light emitted by the guest layer 8 to be extracted from the side of the cathode 11 (which is opposite to the substrate 2). The anode 4 thus includes a reflective electrode 3a (reflective layer) and a light-transmitting electrode 3b that are stacked in this order on top of each other.

With the anode 4 configured as above, a portion of light emitted by the guest layer 8 which portion travels toward the side of the anode 4 passes through the light-transmitting electrode 3b of the anode 4 and is then reflected by the reflective electrode 3a of the anode 4 to pass through the light-transmitting electrode 3b of the anode 4 again and be then extracted from the side of the cathode 11.

The present embodiment uses (i) a Ag film with a thickness of 100 nm as the reflective electrode 3a and (ii) an indium tin oxide (ITO) film with a thickness of 110 nm as the light-transmitting electrode 3b. The respective materials and thicknesses of the reflective electrode 3a and the light-transmitting electrode 3b are, however, not limited to the above examples as long as the reflective electrode 3a and the light-transmitting electrode 3b have a reflectance and a work function, respectively, that are suitable for a reflective anode.

The ITO film may have a different thickness for a microcavity effect as described later.

The present embodiment described here is an example case in which the anode 4 includes a reflective electrode 3a and a light-transmitting electrode 3b. The anode 4 may alternatively include only a reflective electrode 3a.

(Hole Injection Layer 5 and Hole Transfer Layer 6)

The hole injection layer 5 contains a positive hole injectable material and has the function of improving the efficiency of injecting positive holes into the exciton generating layer 7. The present embodiment described here is an example case in which the hole injection layer 5 is a film of 2,3,6,7,10,11-hexacyano-1,4,5,8,9,12-hexaazatriphenylene (HAT-CN) with a thickness of 28 nm. The material and thickness of the hole injection layer 5 is, however, not limited to the above examples as long as the hole injection layer 5 is capable of improving the efficiency of injecting positive holes into the exciton generating layer 7.

The hole transfer layer 6 contains a positive hole transferable material and has the function of improving the efficiency of transferring positive holes into the exciton generating layer 7. The present embodiment described here is an example case in which the hole transfer layer 6 is a film of di-[4-(N,N-ditolyl-amino)-phenyl]cyclohexane (TAPC) with a thickness of 20 nm. The material and thickness of the hole transfer layer 6 is, however, not limited to the above examples as long as the hole transfer layer 6 is capable of improving the efficiency of transferring positive holes into the exciton generating layer 7.

The present embodiment described here is an example case in which the hole injection layer 5 and the hole transfer layer 6 are two different layers independent of each other. The present embodiment is, however, not limited to such a configuration. The hole injection layer 5 and the hole transfer layer 6 may be replaced with a single, hole injection/hole transfer layer. The organic EL element 1 may include, instead of both the hole injection layer 5 and the hole transfer layer 6, only either of the hole injection layer 5 and the hole transfer layer 6. The organic EL element 1 may include even neither of the hole injection layer 5 and the hole transfer layer 6.

The hole injection layer 5, the hole transfer layer 6, and the hole injection/hole transfer layer may each contain an intrinsic positive hole injectable material or intrinsic positive hole transferable material that is not doped with an impurity. Alternatively, the hole injection layer 5, the hole transfer layer 6, and the hole injection/hole transfer layer may each contain a material that is doped with an impurity for the purpose of improving the electrical conductivity and the like.

(Exciton Generating Layer 7 and Guest Layer 8)

The exciton generating layer 7 is a layer in which positive holes $h^+$ from the anode 4 and electrons $e^-$ from the cathode 11 combine to generate excitons. The exciton generating layer 7 is also a layer that emits light within a red wavelength range (second wavelength range) when part of the excitons generated change to an energy level ($ES_0$) in the ground state (details described later).

The guest layer 8 is a layer that emits light within a blue wavelength range (first wavelength range) when excitons having transitioned from the exciton generating layer 7 change from (i) the lowest singlet excited state, in which an exciton has an energy level ($ES_1$) in the lowest singlet excited state which energy level is higher than an energy level ($ET_1$) in the lowest triplet excited state, to (ii) the ground state, in which an exciton has an energy level ($ES_0$) in the ground state.

FIG. 2 is a diagram illustrating a mechanism by which an organic EL element 1 including an exciton generating layer 7 and a guest layer 8 emits light. FIG. 2 omits (i) the hole injection layer 5 and the hole transfer layer 6 present between the anode 4 and the exciton generating layer 7 and (ii) the electron transfer layer 9 and the electron injection layer 10 present between the cathode 11 and the guest layer 8.

As shown in FIG. 2, the organic EL element 1 includes, as a host material (donor), an exciton generating layer 7 containing a phosphorescent material. The exciton generating layer 7 for the present embodiment contains a phosphorescent material. The guest layer 8 as a guest material (acceptor) is a layer containing a fluorescent material, specifically a layer containing a fluorescent material containing a delayed-fluorescence substance.

Since the exciton generating layer 7 is made of a phosphorescent material, excitons generated in the exciton generating layer 7 theoretically have a 100% chance of having the triplet excited state ($T_1$ state).

Part of the excitons having an energy level ($ET_1$) in the lowest triplet excited state in the exciton generating layer 7 emit light within the red wavelength range (second wavelength range) when changing into the ground state, whereas the remaining part of the excitons having an energy level ($ET_1$) in the lowest triplet excited state in the exciton generating layer 7 undergo Dexter transfer (triplet-triplet energy transfer [TTET]), that is, transfer into an energy level ($ET_1$) in the lowest triplet excited state in the guest layer 8.

Causing Dexter transfer requires the exciton generating layer 7 and the guest layer 8 to be adjacent to each other. In order for energy transfer to occur efficiently through Dexter transfer, the distance is preferably not more than 2 nm between (i) that surface of the guest layer 8 which faces the cathode 11 and (ii) that surface of the exciton generating layer 7 which faces the anode 4.

The energy level ($ET_1$) in the lowest triplet excited state in the exciton generating layer 7 needs to be higher than the energy level ($ET_1$) in the lowest triplet excited state in the guest layer 8.

Excitons having undergone Dexter transfer from the lowest triplet excited state in the exciton generating layer 7 to the lowest triplet excited state in the guest layer 8 then undergo triplet-triplet annihilation (TTA) to be upconverted to the lowest singlet excited state in the guest layer 8, in which an exciton has an energy level higher than (i) the energy level ($ES_1$) in the lowest singlet excited state in the exciton generating layer 7 and (ii) the energy level ($ET_1$) in the lowest triplet excited state in the guest layer 8.

The guest layer 8 desirably has a thickness of not more than 1 nm in order to efficiently cause triplet-triplet annihilation (TTA) in the guest layer 8.

Triplet-triplet annihilation (TTA) refers to two excitons having being transferred from the exciton generating layer 7 to the guest layer 8 through Dexter transfer colliding with each other within their respective light emission lifetimes. Triplet-triplet annihilation (TTA) causes one of the two excitons each having the lowest triplet excited state in the guest layer 8 to be upconverted to the lowest singlet excited state in the guest layer 8, in which an exciton has a higher energy level.

In view of the above points, the present embodiment uses (i) as the exciton generating layer 7, a film having a thickness of 1 nm and containing platinum(II) octaethylporphyrin (PtOEP), which is a phosphorescent material that emits light within the red wavelength range, and (ii) as the guest layer 8, a film having the same thickness of 1 nm and containing 9,10-diphenylanthracene (DPA), which is a fluorescent material that emits light within the blue wavelength range and which has a high fluorescence quantum yield.

The organic EL element 1 includes an exciton generating layer 7 and a guest layer 8 as two different layers independent of each other, so that excitons are generated in the exciton generating layer 7 only and are not directly generated in the guest layer 8. The organic EL element 1 thus has a high light emission efficiency.

(Electron Transfer Layer 9 and Electron Injection Layer 10)

The electron transfer layer 9, illustrated in FIG. 1, contains an electron transferable material and has the function of improving the efficiency of transferring electrons into the exciton generating layer 7. The present embodiment described here is an example case in which the electron transfer layer 9 is a film of 1,3,5-tri(m-pyridin-3-ylphenyl) benzene (TmPyPB) with a thickness of 40 nm. The material and thickness of the electron transfer layer 9 is, however, not limited to the above examples as long as the electron transfer layer 9 is capable of improving the efficiency of transferring electrons into the exciton generating layer 7.

The electron injection layer 10 contains an electron injectable material and has the function of improving the efficiency of injecting electrons into the exciton generating layer 7. The present embodiment described here is an example case in which the electron injection layer 10 is a film of LiF with a thickness of 1 nm. The material and thickness of the electron injection layer 10 is, however, not limited to the above examples as long as the electron injection layer 10 is capable of improving the efficiency of injecting electrons into the exciton generating layer 7.

The present embodiment described here is an example case in which the electron transfer layer 9 and the electron injection layer 10 are two different layers independent of each other. The present embodiment is, however, not limited to such a configuration. The electron transfer layer 9 and the electron injection layer 10 may be replaced with a single, electron injection/electron transfer layer. The organic EL element 1 may include, instead of both the electron transfer layer 9 and the electron injection layer 10, only either of the electron transfer layer 9 and the electron injection layer 10. The organic EL element 1 may include even neither of the electron transfer layer 9 and the electron injection layer 10.

The electron transfer layer 9, the electron injection layer 10, and the electron injection/electron transfer layer may each contain an intrinsic electron injectable material or intrinsic electron transferable material that is not doped with an impurity. Alternatively, the electron transfer layer 9, the electron injection layer 10, and the electron injection/electron transfer layer may each contain a material that is doped with an impurity for the purpose of improving the electrical conductivity and the like.

The organic EL element 1 may further include either or both of a hole blocking layer and an electron blocking layer.

The organic EL element 1 includes (i) as the hole transfer layer 6, a film of di-[4-(N,N-ditolyl-amino)-phenyl]cyclohexane (TAPC) with a thickness of 20 nm and (ii) as the electron transfer layer 9, a film of 1,3,5-tri(m-pyridin-3-ylphenyl)benzene (TmPyPB) with a thickness of 40 nm. The organic EL element 1 thus has an electron transferability higher than its positive hole transferability.

The organic EL element 1 is thus preferably configured such that the exciton generating layer 7 is close to the hole transfer layer 6 and that the guest layer 8 is close to the electron transfer layer 9. This configuration allows the exciton generating layer 7 to generate excitons more efficiently.

The organic EL element 1 may have a positive hole transferability higher than its electron transferability depending on any of the respective materials and thicknesses of the hole transfer layer 6 and electron transfer layer 9. The organic EL element 1 is, in such a case, preferably configured such that the exciton generating layer 7 is close to the electron transfer layer 9 and that the guest layer 8 is close to the hole transfer layer 6.

(Cathode 11)

The cathode 11, illustrated in FIG. 1, only needs to have the function as an electrode for injecting electrons e⁻ into the exciton generating layer 7.

The cathode 11 is not particularly limited in terms of shape, structure, size, and the like, and those properties can be appropriately selected in accordance with use and/or purpose of the organic EL element 1.

The organic EL element 1 is, as described above, of the top emission type, that is, causes light emitted by the guest layer 8 to be extracted from the side of the cathode 11 (which is opposite to the substrate 2). The cathode 11 is thus a semi-transmissive reflective layer.

The cathode 11, which is a semi-transmissive reflective layer, reflects part of light incident thereon and transmits the other part of the light so that the other part of the light is extracted to the outside.

The present embodiment uses, as the cathode 11, a 20 nm-thick film of an alloy of Ag and Mg mixed at a ratio of 0.9:0.1. The material and thickness of the cathode 11 are, however, not limited to the above examples as long as the cathode 11 has a transmittance, a reflectance, and a work function that are suitable for a cathode.

(Microcavity Structure)

Microcavity refers to emitted light being subjected to multiple reflection and resonance between an anode and a cathode to result in a sharp emission spectrum and an amplified emission intensity at a peak wavelength.

The microcavity effect may be produced by, for instance, optimally designing the respective reflectances and thicknesses of the anode and cathode, the thickness of an organic layer, and/or the like.

The organic EL element 1, which is of the top emission type, includes (i) a stack of a reflective electrode 3a and a light-transmitting electrode 3b as the anode 4 and (ii) a semi-transmissive reflective layer as the cathode 11. The reflective electrode 3a and the cathode 11 are thus separated from each other by a distance that allows for an increase in intensity of light that is emitted by the guest layer 8 and that is within the blue wavelength range (first wavelength range). The organic EL element 1 in accordance with the present embodiment is thus of the top emission type with an increased light intensity within the blue wavelength range.

The reflective electrode 3a and the cathode 11 are preferably separated from each other by a distance that allows for an increase in intensity of a center wavelength of light that is emitted by the guest layer 8 and that is within the blue wavelength range (first wavelength range).

The reflective electrode 3a and the cathode 11 are separated from each other by a distance adjusted on the basis of the thickness of a vapor-deposited film (including the light-transmitting electrode 3b, the hole injection layer 5, the hole transfer layer 6, the exciton generating layer 7, the guest layer 8, the electron transfer layer 9, and the electron injection layer 10) between the reflective electrode 3a and the cathode 11 which vapor-deposited film includes at least the exciton generating layer 7 and the guest layer 8 (organic layers). The thickness of the vapor-deposited film preferably satisfies $d=(m\times\lambda)/(2\times n)$, where d is the thickness of the vapor-deposited film, n is the refractive index of the vapor-deposited film, $\lambda$ is the center wavelength of light that is emitted by the guest layer 8 and that is within the blue wavelength range (first wavelength range), and m is an integer of 1 to 10.

The organic EL element 1 is configured such that adjusting the thickness of at least one of the light-transmitting electrode 3b, the hole injection layer 5, the hole transfer layer 6, the exciton generating layer 7, the guest layer 8, the electron transfer layer 9, and the electron injection layer 10 can optimize the distance between the reflective electrode 3a and the cathode 11 and thereby allows light within a desired, particular wavelength range (for the present embodiment, light within the blue wavelength range (first wavelength range)) to be extracted to the outside.

Specifically, the organic EL element 1 includes a 110 nm-thick light-transmitting electrode 3b, a 28 nm-thick hole injection layer 5, a 20 nm-thick hole transfer layer 6, a 1 nm-thick exciton generating layer 7, a 1 nm-thick guest layer 8, a 40 nm-thick electron transfer layer 9, and a 1 nm-thick electron injection layer 10, the reflective electrode 3a and the cathode 11 being separated from each other by a distance of 201 nm.

The present embodiment described here is an example case in which the reflective electrode 3a and the cathode 11 are separated from each other by a distance optimized for light within the blue wavelength range (first wavelength range) to be extracted to the outside. The present embodiment is, however, not limited to such a configuration. The reflective electrode 3a and the cathode 11 may alternatively be separated from each other by a distance optimized for light that is emitted by the exciton generating layer 7 and that is within the red wavelength range (second wavelength range) to be extracted to the outside.

As described above, the organic EL element 1 has a high light emission efficiency, emits light having different wavelength ranges including short-wavelength light having a high chromaticity, and allows light within a desired, particular wavelength range to be extracted.

The present embodiment described here is an example case in which the exciton generating layer 7 contains platinum(II) octaethylporphyrin (PtOEP), which is a phosphorescent material that emits light within the red wavelength range. The present embodiment is, however, not limited to such a configuration. The exciton generating layer may alternatively contain, for example, Ir(PPy)3 or Ir(PPy)2(acac), each of which is a phosphorescent material that emits light within the green wavelength range.

The present embodiment described here is an example case in which the guest layer 8 emits light within the blue wavelength range (first wavelength range) when excitons having transitioned from the exciton generating layer 7 change from (i) an energy level ($ES_1$) in the lowest singlet excited state, in which an exciton has an energy level higher than an energy level ($ET_1$) in the lowest triplet excited state in the guest layer 8, to (ii) the ground state. The present embodiment is, however, not limited to such a configuration. In a case where the exciton generating layer 7 contains a phosphorescent material that emits light within the red wavelength range, the guest layer 8 may be a layer that emits light within the blue wavelength range (first wavelength range) as well as light within the green wavelength range (third wavelength range).

The emission wavelength range of the phosphorescent material and that of the fluorescent material may overlap with each other.

Embodiment 2

Figure 3:
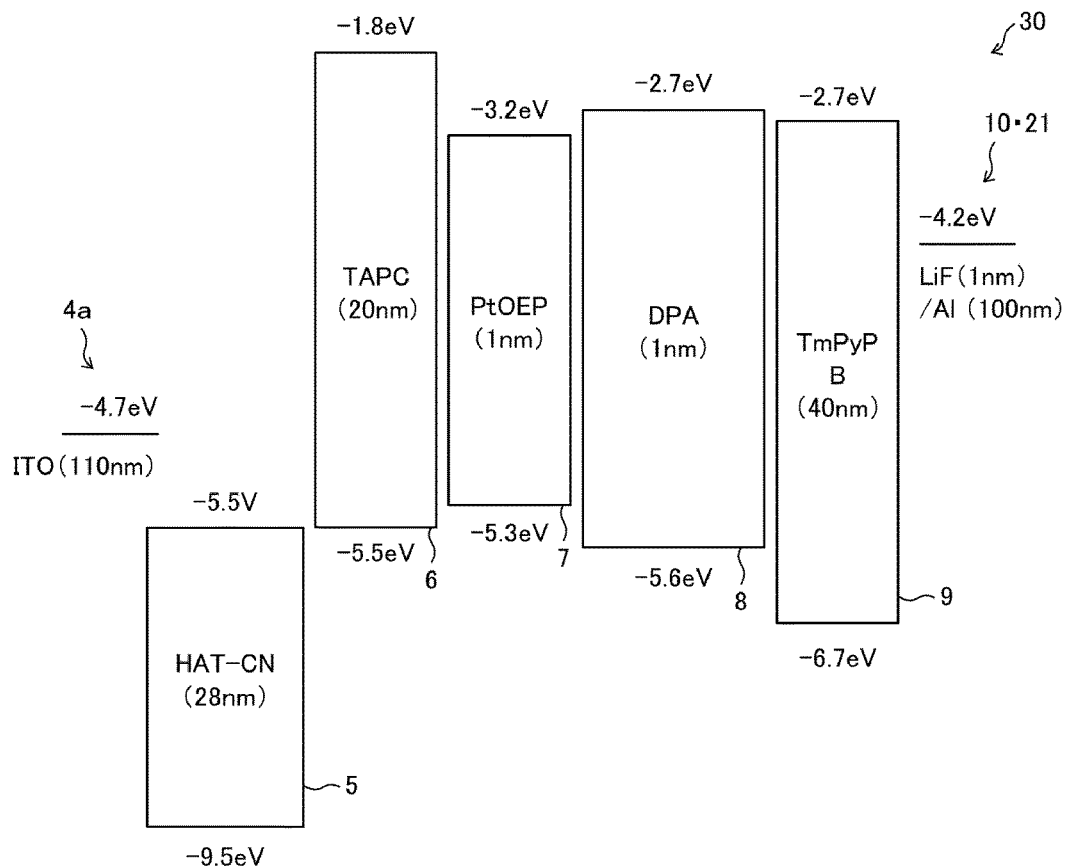
FIG. 3 is a diagram illustrating the respective energy bands and thicknesses of individual layers included in an organic EL element in accordance with Embodiment 2.
Figure 4:
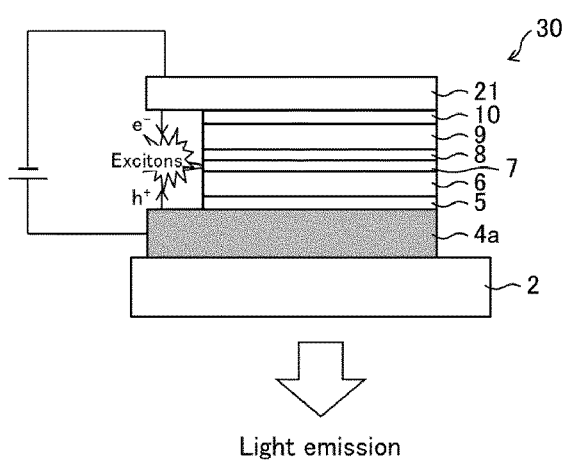
FIG. 4 is a diagram illustrating a cross section of an organic EL element in accordance with Embodiment 2, the diagram schematically illustrating a configuration of the organic EL element.

The following description will discuss Embodiment 2 of the disclosure with reference to FIGS. 3 and 4. The present embodiment is identical to Embodiment 1 except that the present embodiment includes an organic EL element 30 of the bottom emission type. A member of the present embodiment which member is identical in function to a member illustrated in the drawings for Embodiment 1 is assigned the same reference sign and is not described again here for convenience.

FIG. 3 is a diagram illustrating the respective energy bands and thicknesses of individual layers included in an organic EL element 30 in accordance with the present embodiment.

As shown in FIG. 3, the organic EL element 30, which is of the bottom emission type, includes an ITO layer as an anode 4a and a single Al layer as a cathode 21.

The present embodiment uses (i) as the anode 4a, an ITO layer having a thickness of 110 nm and (ii) as the cathode 21, a single Al layer having a thickness of 100 nm. The other layers of the present embodiment, namely the hole injection layer 5, the hole transfer layer 6, the exciton generating layer 7, the guest layer 8, the electron transfer layer 9, and the electron injection layer 10, are identical in material and thickness to those of Embodiment 1 above.

Specifically, the organic EL element 30 includes a 110 nm-thick ITO layer as the anode 4a, a 28 nm-thick hole injection layer 5, a 20 nm-thick hole transfer layer 6, a 1 nm-thick exciton generating layer 7, a 1 nm-thick guest layer 8, a 40 nm-thick electron transfer layer 9, and a 1 nm-thick electron injection layer 10, the substrate 2 and the cathode 21 being separated from each other by a distance of 201 nm.

FIG. 3 shows the respective energy bands of the anode 4a, the hole injection layer 5, the hole transfer layer 6, the exciton generating layer 7, the guest layer 8, the electron transfer layer 9, and a combination of the electron injection layer 10 and the cathode 21.

FIG. 4 is a diagram illustrating a cross section of an organic EL element 30 in accordance with the present embodiment, the diagram schematically illustrating a configuration of the organic EL element 30.

As illustrated in FIG. 4, the organic EL element 30 is of the bottom emission type, that is, causes light emitted by the guest layer 8 to be extracted from the side of the substrate 2.

In order to cause light emitted by the guest layer 8 to be extracted from the side of the substrate 2, the substrate 2 needs to be a light-transmitting substrate such as a glass substrate.

The organic EL element 30 may include (i) a semi-transmissive reflective layer as an anode 4a on the substrate 2 and (ii) as a cathode 21 (counter electrode), a single-layer structure or multiple-layer structure including a reflective layer. The present embodiment uses (i) as the anode 4a, an ITO layer having a thickness of 110 nm and (ii) as the cathode 21, a single Al layer having a thickness of 100 nm.

The present embodiment described here is an example case in which the anode 4a and the cathode 21 are separated from each other by a distance optimized for light within the blue wavelength range (first wavelength range) to be extracted to the outside. The present embodiment is, however, not limited to such a configuration. The anode 4a and the cathode 21 may alternatively be separated from each other by a distance optimized for light that is emitted by the exciton generating layer 7 and that is within the red wavelength range (second wavelength range) to be extracted to the outside.

In a case where the anode 4a and the cathode 21 are separated from each other by a distance optimized for light that is emitted by the guest layer 8 and that is within the blue wavelength range (first wavelength range) to be extracted to the outside, the organic EL element 30 preferably has a light-emitting region with a size equal to the size of the guest layer 8. In a case where the anode 4a and the cathode 21 are separated from each other by a distance optimized for light that is emitted by the exciton generating layer 7 and that is within the red wavelength range (second wavelength range) to be extracted to the outside, the organic EL element 30 preferably has a light-emitting region with a size equal to the size of the exciton generating layer 7.

As described above, the organic EL element 30, which is of the bottom emission type, also has a high light emission efficiency, emits light having different wavelength ranges including short-wavelength light having a high chromaticity, and allows light within a desired, particular wavelength range to be extracted.

Embodiment 3

Figure 5:
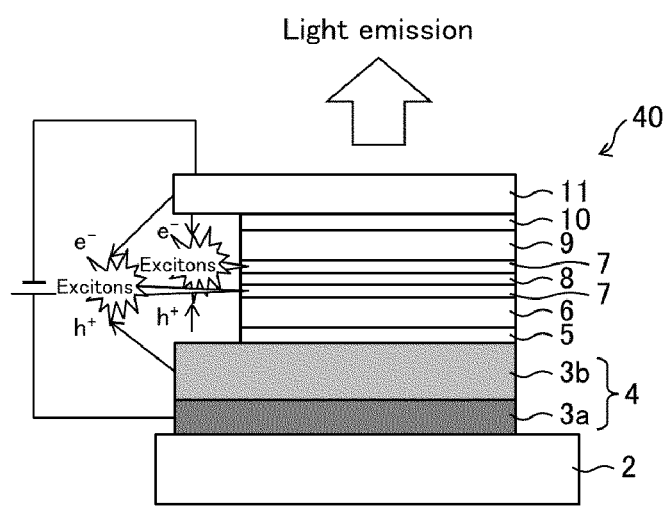
FIG. 5 is a diagram illustrating a cross section of an organic EL element in accordance with Embodiment 3, the diagram schematically illustrating a configuration of the organic EL element.
Figure 6:
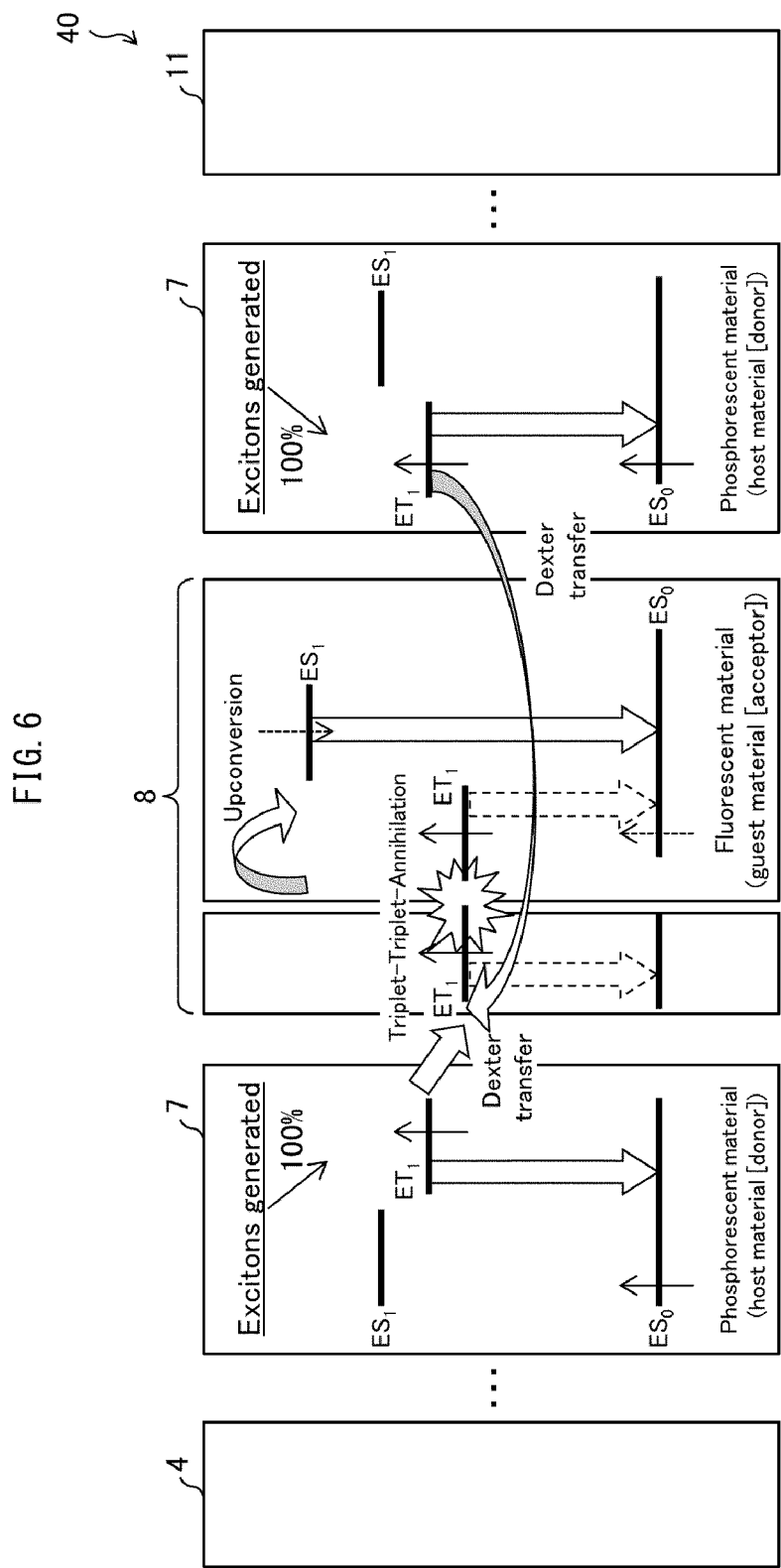
FIG. 6 is a diagram illustrating a mechanism by which the organic EL element illustrated in FIG. 5 emits light.

The following description will discuss Embodiment 3 of the disclosure with reference to FIGS. 5 and 6. The present embodiment is identical to Embodiment 1 except that the present embodiment includes an organic EL element 40 of the top emission type which organic EL element 40 includes two exciton generating layers 7 each containing a phosphorescent material, the two exciton generating layers 7 being in contact respectively with the upper and lower surfaces of the guest layer 8. A member of the present embodiment which member is identical in function to a member illustrated in the drawings for Embodiment 1 is assigned the same reference sign and is not described again here for convenience.

FIG. 5 is a diagram illustrating a cross section of an organic EL element 40 of the top emission type in accordance with the present embodiment, the diagram schematically illustrating a configuration of the organic EL element 40.

As illustrated in FIG. 5, the organic EL element 40 in accordance with the present embodiment includes a substrate 2 as a base, and also includes a stack on the substrate 2 which stack includes in sequence an anode 4, a hole injection layer 5, a hole transfer layer 6, an exciton generating layer 7 (first layer), a guest layer 8 (second layer), another exciton generating layer 7 (first layer), an electron transfer layer 9, an electron injection layer 10, and a cathode 11.

FIG. 6 is a diagram illustrating a mechanism by which an organic EL element 40 emits light which organic EL element 40 includes two exciton generating layers 7 each containing a phosphorescent material, the two exciton generating layers 7 being in contact respectively with the upper and lower surfaces of the guest layer 8. FIG. 6 omits (i) the hole injection layer 5 and the hole transfer layer 6 present between the anode 4 and that exciton generating layer 7 which is present on the side of the anode 4 and (ii) the electron transfer layer 9 and the electron injection layer 10 present between the cathode 11 and that exciton generating layer 7 which is present on the side of the cathode 11.

Each exciton generating layer 7 is a layer in which positive holes h+ from the anode 4 and electrons e− from the cathode 11 combine to generate excitons. Each exciton generating layer 7 is also a layer that emits light within a red wavelength range (second wavelength range) when part of the excitons generated change to an energy level ($ES_0$) in the ground state.

As in Embodiment 1 described above, the guest layer 8 emits light within the blue wavelength range (first wavelength range) when excitons having transitioned from the exciton generating layer 7 change from (i) the lowest singlet excited state, in which an exciton has an energy level higher than an energy level ($ET_1$) in the lowest triplet excited state in the guest layer 8, to (ii) the ground state.

As shown in FIG. 6, the organic EL element 40 includes (i) as a host material (donor), exciton generating layers 7 each containing a phosphorescent material and (ii) as a guest material (acceptor), a guest layer 8 containing a fluorescent material.

Since the exciton generating layers 7 (one of which is present on the side of the anode 4 and the other of which is present on the side of the cathode 11) are each made of a phosphorescent material, excitons generated in the two exciton generating layers 7 theoretically have a 100% chance of having the triplet excited state ($T_1$ state).

Excitons having an energy level ($ET_1$) in the lowest triplet excited state in the two exciton generating layers 7 undergo Dexter transfer (triplet-triplet energy transfer [TTET]), that is, transfer into an energy level ($ET_1$) in the lowest triplet excited state in the guest layer 8.

Part of the excitons having an energy level ($ET_1$) in the lowest triplet excited state in the two exciton generating layers 7 do not undergo energy transfer to the lowest triplet excited state, in which an exciton has an energy level ($ET_1$) in the guest layer 8, and may emit light within at least two different wavelength ranges when changing from an energy level ($ET_1$) in the lowest triplet excited state in the exciton generating layers 7 to the ground state.

The organic EL element 40 is configured such that adjusting the thickness of at least one of the light-transmitting electrode 3b, the hole injection layer 5, the hole transfer layer 6, the exciton generating layers 7, the guest layer 8, the electron transfer layer 9, and the electron injection layer 10 can optimize the distance between the reflective electrode 3a and the cathode 11 and thereby allows light within a desired, particular wavelength range to be extracted to the outside. The organic EL element 40 may be configured to cause light within two different wavelength ranges to be both extracted to the outside.

In order for excitons having the lowest triplet excited state in the two exciton generating layers 7 to easily undergo Dexter transfer to the lowest triplet excited state in the guest layer 8, the two exciton generating layers 7 and the guest layer 8 need to be adjacent to each other. The distance is preferably not more than 2 nm between (i) that surface of the guest layer 8 which faces the cathode 11 and (ii) that surface of the exciton generating layer 7 present on the side of the anode 4 which faces the anode 4. The distance is preferably not more than 2 nm also between (i) that surface of the guest layer 8 which faces the anode 4 and (ii) that surface of the exciton generating layer 7 present on the side of the cathode 11 which faces the cathode 11.

The energy level ($ET_1$) in the lowest triplet excited state in the two exciton generating layers 7 needs to be higher than the energy level ($ET_1$) in the lowest triplet excited state in the guest layer 8.

Excitons having undergone Dexter transfer from the lowest triplet excited state in the two exciton generating layers 7 to the lowest triplet excited state in the guest layer 8 then undergo triplet-triplet annihilation (TTA) to be upconverted to a singlet excited state in the guest layer 8, in which an exciton has an energy level higher than (i) the energy level ($ES_1$) in the lowest singlet excited state in the two exciton generating layers 7 and (ii) the energy level ($ET_1$) in the lowest triplet excited state in the guest layer 8.

The guest layer 8 desirably has a thickness of not more than 1 nm in order to efficiently cause triplet-triplet annihilation (TTA) in the guest layer 8.

Thus, the present embodiment uses (i) as each of the two exciton generating layers 7, a film having a thickness of 0.5 nm and containing platinum(II) octaethylporphyrin (PtOEP), which is a phosphorescent material that emits light within the red wavelength range, and (ii) as the guest layer 8, a film having a thickness of 1 nm and containing 9,10-diphenylanthracene (DPA), which is a fluorescent material that emits light within the blue wavelength range and which has a high fluorescence quantum yield.

Specifically, the organic EL element 40 includes a 110 nm-thick light-transmitting electrode 3b, a 28 nm-thick hole injection layer 5, a 20 nm-thick hole transfer layer 6, a 0.5 nm-thick exciton generating layer 7 on the side of the anode 4, a 1 nm-thick guest layer 8, a 0.5 nm-thick exciton generating layer 7 on the side of the cathode 11, a 40 nm-thick electron transfer layer 9, and a 1 nm-thick electron injection layer 10, the reflective electrode 3a and the cathode 11 being separated from each other by a distance of 201 nm.

Embodiment 4

Figure 7:
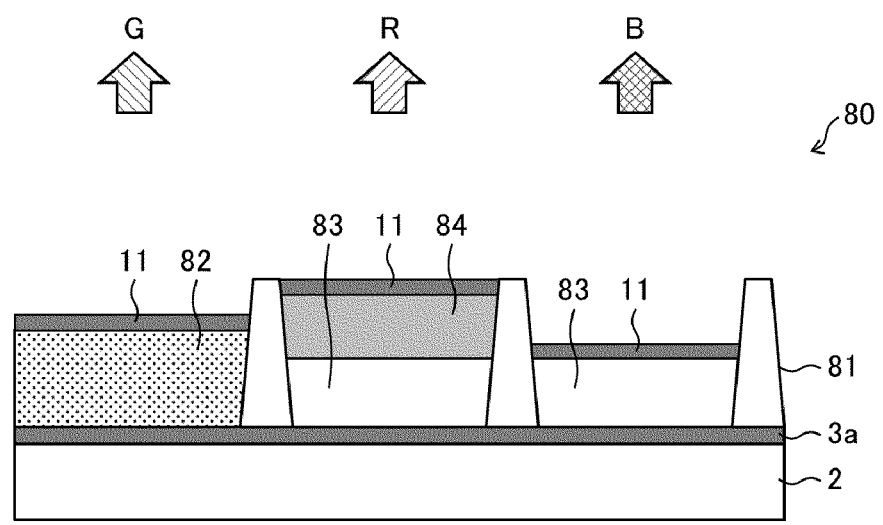
FIG. 7 is a diagram illustrating a cross section of an organic EL display device in accordance with Embodiment 4, the diagram schematically illustrating a configuration of the organic EL display device.

The following description will discuss Embodiment 4 of the disclosure with reference to FIG. 7. The present embodiment is identical to Embodiments 1 to 3 except that the present embodiment is an organic EL display device 80 including a plurality of organic EL elements. A member of the present embodiment which member is identical in function to a member illustrated in the drawings for Embodiments 1 to 3 is assigned the same reference sign and is not described again here for convenience.

FIG. 7 is a diagram illustrating a cross section of an organic EL display device 80 in accordance with the present embodiment, the diagram schematically illustrating a configuration of the organic EL display device 80.

As illustrated in FIG. 7, the organic EL display device 80 includes an organic EL element configured to emit blue light (B), an organic EL element configured to emit green light (G), and an organic EL element configured to emit red light (R), the individual organic EL elements being separated from each other by a bank member 81.

The organic EL display device 80 may include, as the organic EL element configured to emit blue light (B), one of the organic EL elements 1, 30, and 40 (described for Embodiments 1 to 3 above), for example, the organic EL element 1.

In a case where the organic EL display device 80 includes the organic EL element 1 as the organic EL element configured to emit blue light (B), the organic EL element configured to emit blue light (B) includes between the reflective electrode 3a and the cathode 11 a vapor-deposited layer 83 including a light-transmitting electrode 3b, a hole injection layer 5, a hole transfer layer 6, an exciton generating layer 7, a guest layer 8, an electron transfer layer 9, and an electron injection layer 10.

The organic EL element configured to emit red light (R), included in the organic EL display device 80, includes on a reflective electrode 3a a vapor-deposited layer 83 including a light-transmitting electrode 3b, a hole injection layer 5, a hole transfer layer 6, an exciton generating layer 7, a guest layer 8, an electron transfer layer 9, and an electron injection layer 10. The organic EL element configured to emit red light (R) further includes on the vapor-deposited layer 83 a film thickness adjustment layer 84 for adjusting the distance between the reflective electrode 3a and the cathode 11 so that the distance allows for an increase in intensity of light within the red wavelength range.

The present embodiment uses, as the film thickness adjustment layer 84, a transparent electrode electrically connected to the cathode 11. The present embodiment is, however, not limited to such a configuration.

The organic EL element configured to emit green light (G), included in the organic EL display device 80, includes between the reflective electrode 3a and the cathode 11 a vapor-deposited layer 82 including a light-transmitting electrode, a hole injection layer, a hole transfer layer, a green light emitting layer, an electron transfer layer, and an electron injection layer.

The organic EL element configured to emit blue light (B) and the organic EL element configured to emit red light (R), both included in the organic EL display device 80, may include identical light-emitting layers (namely, an exciton generating layer 7 and a guest layer 8).

Embodiment 5

Figure 8:
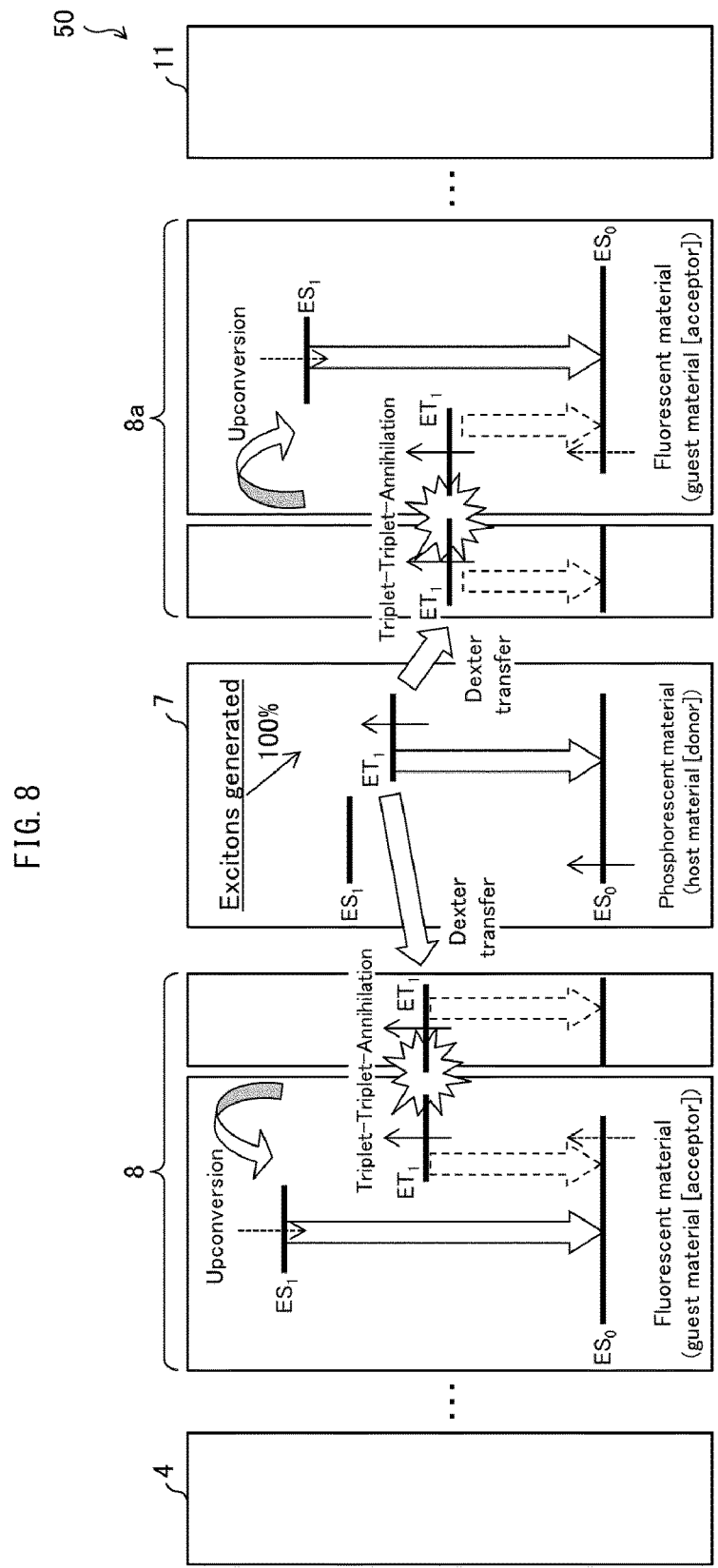
FIG. 8 is a diagram illustrating a mechanism by which an organic EL element included in the organic EL display device in accordance with Embodiment 5 emits light.
Figure 9:
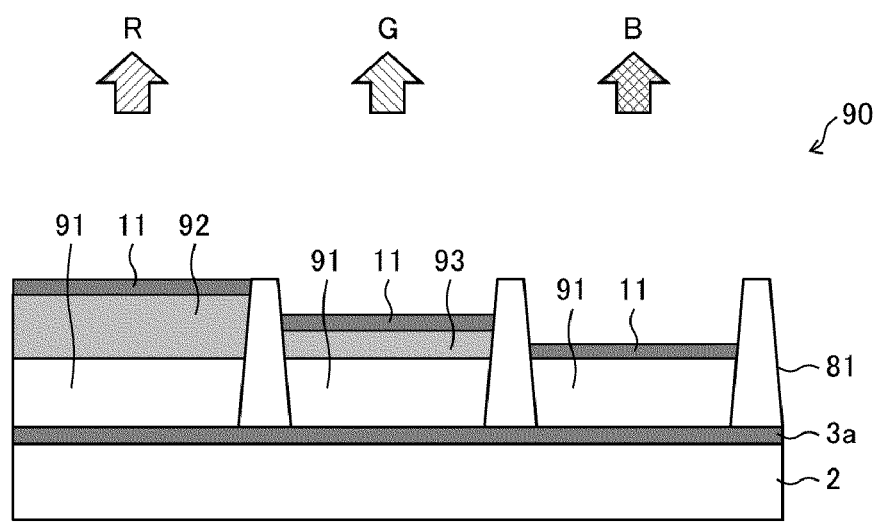
FIG. 9 is a diagram illustrating a cross section of the organic EL display device illustrated in FIG. 8, the diagram schematically illustrating a configuration of the organic EL display device.

The following description will discuss Embodiment 5 of the disclosure with reference to FIGS. 8 and 9. The present embodiment is identical to Embodiment 4 except that the organic EL element configured to emit red light (R), the organic EL element configured to emit green light (G), and the organic EL element configured to emit blue light (B) include identical light-emitting layers (namely, an exciton generating layer 7, a guest layer 8, and a guest layer 8a). A member of the present embodiment which member is identical in function to a member illustrated in the drawing for Embodiment 4 is assigned the same reference sign and is not described again here for convenience.

FIG. 8 is a diagram illustrating a mechanism by which an organic EL element 50 emits light which organic EL element 50 includes a guest layer 8 and a guest layer 8a both adjacent to an exciton generating layer 7. FIG. 8 omits (i) the hole injection layer 5 and the hole transfer layer 6 present between the anode 4 and the guest layer 8 and (ii) the electron transfer layer 9 and the electron injection layer 10 present between the cathode 11 and the guest layer 8a.

As shown in FIG. 8, the organic EL element 50 includes, as a host material (donor), an exciton generating layer 7 containing a phosphorescent material. The exciton generating layer 7 for the present embodiment is made of a phosphorescent material. The guest layer 8 and the guest layer 8a as a guest material (acceptor) are each a layer containing a fluorescent material, specifically a layer containing a fluorescent material containing a delayed-fluorescence substance.

Since the exciton generating layer 7 is made of a phosphorescent material, excitons generated in the exciton generating layer 7 theoretically have a 100% chance of having the triplet excited state ($T_1$ state).

Part of the excitons having an energy level ($ET_1$) in the lowest triplet excited state in the exciton generating layer 7 emit light within the red wavelength range (second wavelength range) when changing into an energy level ($ES_0$) in the ground state, whereas the remaining part of the excitons having an energy level ($ET_1$) in the lowest triplet excited state in the exciton generating layer 7 undergo Dexter transfer (triplet-triplet energy transfer [TTET]), that is, transfer into an energy level ($ET_1$) in the lowest triplet excited state in the guest layer 8 and the guest layer 8a.

Causing Dexter transfer requires (i) the exciton generating layer 7 and the guest layer 8 or (ii) the exciton generating layer 7 and the guest layer 8a to be adjacent to each other. In order for energy transfer to occur efficiently through Dexter transfer, the distance is preferably not more than 2 nm between (i) that surface of the guest layer 8 which faces the anode 4 and (ii) that surface of the exciton generating layer 7 which faces the cathode 11, and the distance is preferably not more than 2 nm between (i) that surface of the guest layer 8a which faces the cathode 11 and (ii) that surface of the exciton generating layer 7 which faces the anode 4.

The energy level ($ET_1$) in the lowest triplet excited state in the exciton generating layer 7 needs to be higher than (i) the energy level ($ET_1$) in the lowest triplet excited state in the guest layer 8 and (ii) the energy level ($ET_1$) in the lowest triplet excited state in the guest layer 8a.

Excitons having undergone Dexter transfer from the energy level ($ET_1$) in the lowest triplet excited state in the exciton generating layer 7 to the energy level ($ET_1$) in the lowest triplet excited state in the guest layer 8 then undergo triplet-triplet annihilation (TTA) to be upconverted to a singlet excited state in the guest layer 8, in which an exciton has an energy level higher than (i) the energy level ($ES_1$) in the lowest singlet excited state in the exciton generating layer 7 and (ii) the energy level ($ET_1$) in the lowest triplet excited state in the guest layer 8.

The guest layer 8 desirably has a thickness of not more than 1 nm in order to efficiently cause triplet-triplet annihilation (TTA) in the guest layer 8.

Similarly, excitons having undergone Dexter transfer from the energy level ($ET_1$) in the lowest triplet excited state in the exciton generating layer 7 to the energy level ($ET_1$) in the lowest triplet excited state in the guest layer 8a then undergo triplet-triplet annihilation (TTA) to be upconverted to a singlet excited state in the guest layer 8a, in which an exciton has an energy level higher than (i) the energy level ($ES_1$) in the lowest singlet excited state in the exciton generating layer 7 and (ii) the energy level ($ET_1$) in a triplet excited state in the guest layer 8a.

The guest layer 8a desirably has a thickness of not more than 1 nm in order to efficiently cause triplet-triplet annihilation (TTA) in the guest layer 8a.

The guest layer 8 emits light within the blue wavelength range (first wavelength range) when excitons having transitioned from the exciton generating layer 7 change from (i) the lowest singlet excited state, in which an exciton has an energy level higher than an energy level ($ET_1$) in the lowest triplet excited state in the guest layer 8, to (ii) the ground state.

The guest layer 8a emits light within the green wavelength range (third wavelength range) when excitons having transitioned from the exciton generating layer 7 change from (i) the lowest singlet excited state, in which an exciton has an energy level higher than an energy level ($ET_1$) in the lowest triplet excited state in the guest layer 8, to (ii) the ground state.

The present embodiment uses (i) as the exciton generating layer 7, a film having a thickness of 1 nm and containing platinum(II) octaethylporphyrin (PtOEP), which is a phosphorescent material that emits light within the red wavelength range, (ii) as the guest layer 8, a film having a thickness of 0.5 nm and containing 9,10-diphenylanthracene (DPA), which is a fluorescent material that emits light within the blue wavelength range and which has a high fluorescence quantum yield, and (iii) as the guest layer 8a, a film having a thickness of 0.5 nm and containing 9,10-bis(phenylethynyl)anthracene, which is a fluorescent material that emits light within the green wavelength range.

FIG. 9 is a diagram illustrating a cross section of an organic EL display device 90 in accordance with the present embodiment, the diagram schematically illustrating a configuration of the organic EL display device 90.

As illustrated in FIG. 9, the organic EL display device 90 includes an organic EL element configured to emit blue light (B), an organic EL element configured to emit green light (G), and an organic EL element configured to emit red light (R), the individual organic EL elements being separated from each other by a bank member 81.

The organic EL display device 90 includes, for example, the organic EL element 50 of FIG. 8 as the organic EL element configured to emit blue light (B).

The organic EL element configured to emit blue light (B), included in the organic EL display device 90, includes between the reflective electrode 3a and the cathode 11 a vapor-deposited layer 91 including a light-transmitting electrode 3b, a hole injection layer 5, a hole transfer layer 6, a guest layer 8 that emits light within the blue wavelength range (first wavelength range), an exciton generating layer 7 that emits light within the red wavelength range (second wavelength range), a guest layer 8a that emits light within the green wavelength range (third wavelength range), an electron transfer layer 9, and an electron injection layer 10.

The organic EL element configured to emit green light (G), included in the organic EL display device 90, includes a vapor-deposited layer 91 on the reflective electrode 3a, and also includes on the vapor-deposited layer 91 a film thickness adjustment layer 93 for adjusting the distance between the reflective electrode 3a and the cathode 11 so that the distance allows for an increase in intensity of light within the green wavelength range.

The organic EL element configured to emit red light (R), included in the organic EL display device 90, includes a vapor-deposited layer 91 on the reflective electrode 3a, and also includes on the vapor-deposited layer 91 a film thickness adjustment layer 92 for adjusting the distance between the reflective electrode 3a and the cathode 11 so that the distance allows for an increase in intensity of light within the red wavelength range.

The present embodiment uses, as each of the film thickness adjustment layers 92 and 93, a transparent electrode electrically connected to the cathode 11. The present embodiment is, however, not limited to such a configuration.

The organic EL element configured to emit blue light (B), the organic EL element configured to emit green light (G), and the organic EL element configured to emit red light (R), all included in the organic EL display device 90, may include identical light-emitting layers (namely, an exciton generating layer 7, a guest layer 8, and a guest layer 8a).

<Process of Producing Organic EL Element>

The description below deals briefly with a process of producing the organic EL element 1. Although a typical organic EL element includes a transistor as a switching element, the description below does not deal with a process of producing the transistor.

The process of producing the organic EL element 1 includes a step of forming an anode 4, a step of forming a cathode 11, and a step of forming organic layers (namely, an exciton generating layer 7 and a guest layer 8) between the anode 4 and the cathode 11.

The step of forming organic layers (namely, an exciton generating layer 7 and a guest layer 8) includes a step of forming an exciton generating layer 7 and a step of forming a guest layer 8 in such a manner that the energy level ($ET_1$) in the lowest triplet excited state in the exciton generating layer 7 is higher than the energy level ($ET_1$) in the lowest triplet excited state in the guest layer 8.

In a case where the guest layer 8 is to emit short-wavelength blue light or light within the ultraviolet range, the step of forming organic layers preferably includes a step of forming an exciton generating layer 7 and a step of forming a guest layer 8 in such a manner that the energy level ($ES_1$) in the lowest singlet excited state in the guest layer 8 is higher than the energy level ($ES_1$) in the lowest singlet excited state in the exciton generating layer 7.

The step of forming an exciton generating layer 7 is specifically a step of forming an exciton generating layer 7 in which positive holes $h^+$ from the anode 4 and electrons $e^-$ from the cathode 11 combine to generate excitons and which emits light within the red wavelength range (second wavelength range) when part of the excitons generated change to the ground state.

The step of forming a guest layer 8 is specifically a step of forming a guest layer 8 that has a thickness of not more than 1 nm, that is adjacent to the exciton generating layer 7, and that emits light within the blue wavelength range (first wavelength range) when excitons having transitioned from the exciton generating layer 7 change from (i) the lowest singlet excited state, in which an exciton has an energy level higher than an energy level ($ET_1$) in the lowest triplet excited state, to (ii) the ground state.

The process of producing the organic EL element 1 further includes a step of adjusting the distance between the reflective electrode 3a and the cathode 11 so that the distance allows for an increase in intensity of light that is emitted by the guest layer 8 and that is within the blue wavelength range (first wavelength range).

The step of adjusting the distance between the reflective electrode 3a and the cathode 11 is preferably carried out so that the distance allows for an increase in intensity of the center wavelength of light that is emitted by the guest layer 8 and that is within the blue wavelength range (first wavelength range).

The step of adjusting the distance between the reflective electrode 3a and the cathode 11 may involve adjusting the distance between the reflective electrode 3a and the cathode 11 on the basis of the thickness of a vapor-deposited film (including the light-transmitting electrode 3b, the hole injection layer 5, the hole transfer layer 6, the exciton generating layer 7, the guest layer 8, the electron transfer layer 9, and the electron injection layer 10) between the reflective electrode 3a and the cathode 11 which vapor-deposited film includes at least the exciton generating layer 7 and the guest layer 8 (organic layers). The thickness of the vapor-deposited film preferably satisfies $d=(m \times \lambda)/(2 \times n)$, where d is the thickness of the vapor-deposited film, n is the refractive index of the vapor-deposited film, $\lambda$ is the center wavelength of light that is emitted by the guest layer 8 and that is within the blue wavelength range (first wavelength range), and m is an integer of 1 to 10.

The step of forming an exciton generating layer 7 involves forming an exciton generating layer 7 containing a phosphorescent material. The step of forming a guest layer 8 involves forming a guest layer 8 containing a fluorescent material. The combined thickness of the exciton generating layer 7 and the guest layer 8, formed respectively in the step of forming an exciton generating layer 7 and the step of forming a guest layer 8, is preferably not more than 2 nm.

The process of producing the organic EL element 1 preferably further includes (i) a step of forming a hole transfer layer 6 between the anode 4 and the organic layers (namely, an exciton generating layer 7 and a guest layer 8) and (ii) a step of forming an electron transfer layer 9 between the cathode 11 and the organic layers (namely, an exciton generating layer 7 and a guest layer 8), where in a case where the mobility of electrons $e^-$ in the electron transfer layer 9 is higher than the mobility of positive holes $h^+$ in the hole transfer layer 6, the step of forming a guest layer 8 is preferably carried out between the step of forming an exciton generating layer 7 and the step of forming an electron transfer layer 9.

The process of producing the organic EL element 1 preferably further includes (i) a step of forming a hole transfer layer 6 between the anode 4 and the organic layers (namely, an exciton generating layer 7 and a guest layer 8) and (ii) a step of forming an electron transfer layer 9 between the cathode 11 and the organic layers (namely, an exciton generating layer 7 and a guest layer 8), where in a case where the mobility of positive holes $h^+$ in the hole transfer layer 6 is higher than the mobility of electrons $e^-$ in the electron transfer layer 9, the step of forming a guest layer 8 is carried out between the step of forming an exciton generating layer 7 and the step of forming a hole transfer layer 6.

In a case where the process of producing the organic EL element further includes a step of forming a guest layer 8a, the guest layer 8a has (i) an energy level ($ET_1$) in the lowest triplet excited state in the guest layer 8a, in which an exciton has an energy level different from the energy level ($ET_1$) in the lowest triplet excited state in the guest layer 8, and (ii) an energy level ($ES_1$) in the lowest singlet excited state in the guest layer 8a, in which an exciton has an energy level different from the energy level ($ES_1$) in the lowest singlet excited state in the guest layer 8.

The step of forming a guest layer 8a involves forming a guest layer 8a in which the energy level ($ES_1$) in the lowest singlet excited state may be higher than the energy level ($ES_1$) in the lowest singlet excited state in the exciton generating layer 7 and in which the energy level ($ET_1$) in the lowest triplet excited state is lower than the energy level ($ET_1$) in the lowest triplet excited state in the exciton generating layer 7, the guest layer 8a being configured to emit light within the green wavelength range (third wavelength range) when the excitons having transitioned from the exciton generating layer 7 change from (i) the energy level ($ES_1$) in the lowest singlet excited state in the guest layer 8a, in which an exciton has an energy level higher than the energy level ($ET_1$) in the lowest triplet excited state in the guest layer 8a, to (ii) the ground state.

The step of adjusting the distance between the reflective electrode 3a and the cathode 11 preferably involves adjusting the distance between the reflective electrode 3a and the cathode 11 so that the thickness of a vapor-deposited film (including the light-transmitting electrode 3b, the hole injection layer 5, the hole transfer layer 6, the exciton generating layer 7, the guest layer 8, the electron transfer layer 9, and the electron injection layer 10) between the reflective electrode 3a and the cathode 11 which vapor-deposited film includes at least the exciton generating layer 7 and the guest layer 8 (organic layers) allows for an increase in intensity of one of (i) light within the red wavelength range (second wavelength range), (ii) light within the blue wavelength range (first wavelength range), and (iii) light within the green wavelength range (third wavelength range).

The step of forming an exciton generating layer 7 is preferably carried out twice for formation of two exciton generating layers 7 adjacent to the guest layer 8 in such a manner that the two exciton generating layers 7 are present respectively on the side of the upper surface of the guest layer 8 and on the side of the lower surface (opposite to the upper surface) of the guest layer 8.

[Recap]

An organic electroluminescent element in accordance with a first aspect of the disclosure is an organic electroluminescent element, including: an anode; a cathode; and an organic layer between the anode and the cathode, the organic layer including (i) a first layer containing at least one phosphorescent material and (ii) a second layer containing at least one fluorescent material, at least the first layer and the second layer being adjacent to each other, an energy level in a lowest triplet excited state in the first layer being higher than an energy level in a lowest triplet excited state in the second layer, the second layer having a thickness of not more than 1 nm, the organic electroluminescent element being configured to emit light within at least one wavelength range, the light including light within a first wavelength range which light within the first wavelength range is emitted when an exciton in a lowest singlet excited state in the second layer which exciton is generated in a case where (i) a triplet exciton generated in the first layer undergoes energy transfer to an exciton in a triplet excited state in the second layer and (ii) the exciton in the triplet excited state is upconverted to an exciton in a singlet excited state among molecules in the second layer changes to a ground state.

With the above configuration, the organic layer includes (i) a first layer containing at least one phosphorescent material and (ii) a second layer containing at least one fluorescent material, at least the first layer and the second layer being adjacent to each other, an energy level of molecules in a lowest triplet excited state in the first layer being higher than an energy level in a lowest triplet excited state in the second layer. Further, the second layer having a thickness of not more than 1 nm allows for an efficient energy transfer from triplet excitons of molecules in the first layer to triplet excitons of molecules in the second layer. This makes it possible to provide an organic electroluminescent element having a high light emission efficiency.

With the above configuration, the upconversion from excitons in a triplet excited state that are of molecules in the second layer makes it possible to generate excitons in a singlet excited state that are of molecules in the second layer. This makes it possible to provide an organic electroluminescent element capable of emitting short-wavelength light having a high chromaticity.

An organic electroluminescent element in accordance with a second aspect of the disclosure is configured as in the first aspect and may be further configured such that the light within the at least one wavelength range further includes light within a second wavelength range which light within the second wavelength range is emitted when a triplet exciton generated in the first layer which triplet exciton does not undergo the energy transfer to an exciton in the triplet excited state in the second layer and which triplet exciton is an exciton in the lowest triplet excited state in the first layer changes to a ground state.

The above configuration makes it possible to provide an organic electroluminescent element capable of emitting light including light within the second wavelength range.

An organic electroluminescent element in accordance with a third aspect of the disclosure is configured as in the first or second aspect and may be further configured such that an energy level in the lowest singlet excited state in the second layer is higher than an energy level in a lowest singlet excited state in the first layer.

The above configuration makes it possible to provide an organic electroluminescent element capable of emitting light including light within the first wavelength range, which light within the first wavelength range is generated in a case where excitons in the lowest singlet excited state in the second layer change to the ground state, the light within the first wavelength range having a shorter wavelength.

An organic electroluminescent element in accordance with a fourth aspect of the disclosure is configured as in any one of the first to third aspects and may preferably be further configured such that the first layer and the second layer have a combined thickness of not more than 2 nm.

The above configuration makes it possible to provide an organic electroluminescent element capable of efficient energy transfer of triplet excitons.

An organic electroluminescent element in accordance with a fifth aspect of the disclosure is configured as in the second aspect and may be further configured such that a first one of the anode and the cathode is provided with a reflective layer; a second one of the anode and the cathode is provided with a semi-transmissive reflective layer; and the reflective layer and the semi-transmissive reflective layer are separated from each other by a distance that allows either the light within the first wavelength range or the light within the second wavelength range to have an increased intensity.

With the above configuration, the reflective layer, with which a first one of the anode and the cathode is provided, and the semi-transmissive reflective layer, with which a second one of the anode and the cathode is provided, are separated from each other by a distance that allows either light within the first wavelength range or light within the second wavelength range to have an increased intensity. The above configuration thus makes it possible to provide an organic electroluminescent element capable of extracting light within a desired, particular wavelength range.

An organic electroluminescent element in accordance with a sixth aspect of the disclosure is configured as in the fifth aspect and may preferably be further configured such that the distance between the reflective layer and the semi-transmissive reflective layer has been adjusted by changing a thickness of a vapor-deposited film including at least the organic layer; and $d=(m\times\lambda)/(2\times n)$, where d is the thickness of the vapor-deposited film, n is a refractive index of the vapor-deposited film, $\lambda$ is a center wavelength of the first wavelength range or the second wavelength range, and m is an integer of 1 to 10.

The above configuration makes it possible to provide an organic electroluminescent element of which the optical distance can be set relatively easily.

An organic electroluminescent element in accordance with a seventh aspect of the disclosure is configured as in any one of the first to sixth aspects and may preferably be further configured such that the fluorescent material is a fluorescent material that emits light within a blue range.

The above configuration makes it possible to provide an organic electroluminescent element capable of emitting light within the blue range.

An organic electroluminescent element in accordance with an eighth aspect of the disclosure is configured as in any one of the first to seventh aspects and may preferably be further configured such that the phosphorescent material is a phosphorescent material that emits light within a red range or light within a green range.

The above configuration makes it possible to provide an organic electroluminescent element capable of emitting light within the red range or light within the green range.

An organic electroluminescent element in accordance with a ninth aspect of the disclosure is configured as in any one of the first to eighth aspects and may preferably be further configured such that the anode and the organic layer are separated from each other by a hole transfer layer; the cathode and the organic layer are separated from each other by an electron transfer layer; and the second layer is closer to the hole transfer layer than to the first layer in a case where the hole transfer layer has a positive hole mobility higher than an electron mobility of the electron transfer layer.

The above configuration makes it possible to provide an organic electroluminescent element capable of generating excitons efficiently.

An organic electroluminescent element in accordance with a tenth aspect of the disclosure is configured as in any one of the first to eighth aspects and may preferably be further configured such that the anode and the organic layer are separated from each other by a hole transfer layer; the cathode and the organic layer are separated from each other by an electron transfer layer; and the second layer is closer to the electron transfer layer than to the first layer in a case where the electron transfer layer has an electron mobility higher than a positive hole mobility of the hole transfer layer.

The above configuration makes it possible to provide an organic electroluminescent element capable of generating excitons efficiently.

An organic electroluminescent element in accordance with an eleventh aspect of the disclosure is configured as in any one of the first to tenth aspects and may be further configured such that the organic layer further includes a third layer containing at least one fluorescent material; the third layer is adjacent to the first layer and is present on a first side of the first layer which first side is opposite to a second side of the first layer on which second side the second layer is present; an energy level in a lowest triplet excited state in the third layer is lower than the energy level in the lowest triplet excited state in the first layer and is different from the energy level in the lowest triplet excited state in the second layer; an energy level in a lowest singlet excited state in the third layer is higher than an energy level in a lowest singlet excited state in the first layer and is different from an energy level in the lowest singlet excited state in the second layer; the third layer has a thickness of not more than 1 nm; and the organic electroluminescent element is configured to emit the light within the at least one wavelength range, the light including: the light within the first wavelength range which light within the first wavelength range is emitted when the exciton in the lowest singlet excited state in the second layer which exciton is generated in a case where (i) the triplet exciton generated in the first layer undergoes energy transfer to an exciton in a lowest triplet excited state in the second layer and (ii) the exciton in the lowest triplet excited state is upconverted to an exciton in a lowest singlet excited state among the molecules in the second layer changes to the ground state; light within a third wavelength range which light within the third wavelength range is emitted when an exciton in the lowest singlet excited state in the third layer which exciton is generated in a case where (i) the triplet exciton generated in the first layer undergoes energy transfer to an exciton in the lowest triplet excited state in the third layer and (ii) the exciton in the lowest triplet excited state is upconverted to an exciton in a lowest singlet excited state among molecules in the third layer changes to a ground state; and light within a second wavelength range which light within the second wavelength range is emitted when a triplet exciton generated in the first layer which triplet exciton does not undergo the energy transfer to an exciton in the lowest triplet excited state in the second layer and which triplet exciton is an exciton in the lowest triplet excited state in the first layer changes to a ground state, the first wavelength range being a shorter wavelength range than the third wavelength range, the third wavelength range being a shorter wavelength range than the second wavelength range.

The above configuration makes it possible to provide an organic electroluminescent element capable of light within three different wavelength ranges.

An organic electroluminescent element in accordance with a twelfth aspect of the disclosure is configured as in the eleventh aspect and may be further configured such that a first one of the anode and the cathode is provided with a reflective layer; a second one of the anode and the cathode is provided with a semi-transmissive reflective layer; and the reflective layer and the semi-transmissive reflective layer are separated from each other by a distance that allows one of the light within the first wavelength range, the light within the second wavelength range, and the light within the third wavelength range to have an increased intensity.

With the above configuration, the reflective layer, with which a first one of the anode and the cathode is provided, and the semi-transmissive reflective layer, with which a second one of the anode and the cathode is provided, are separated from each other by a distance that allows one of light within the first wavelength range, light within the second wavelength range, and light within the third wavelength range to have an increased intensity. The above configuration thus makes it possible to provide an organic electroluminescent element capable of extracting light within a desired, particular wavelength range.

An organic electroluminescent display device in accordance with a thirteenth aspect of the disclosure includes: an organic electroluminescent element according to any one of the first to twelfth aspects.

The above configuration makes it possible to provide an organic electroluminescent display device having a high light emission efficiency and capable of emitting short-wavelength light having a high chromaticity.

[Supplemental Notes]

The disclosure is not limited to the embodiments, but can be altered by a skilled person in the art within the scope of the claims. The disclosure also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The disclosure is applicable to an organic electroluminescent element and an organic electroluminescent display device.

REFERENCE SIGNS LIST

1 Organic EL element (organic electroluminescent element)
2 Substrate
3a Reflective electrode (reflective layer)
3b Light-transmitting electrode
4 Anode
4a Anode (semi-transmissive reflective layer)
5 Hole injection layer
6 Hole transfer layer
7 Exciton generating layer (first layer)
8 Guest layer (second layer)
8a Guest layer (third layer)
9 Electron transfer layer
10 Electron injection layer
11 Cathode (semi-transmissive reflective layer)
21 Cathode (reflective layer)
30 Organic EL element (organic electroluminescent element)
40 Organic EL element (organic electroluminescent element)
50 Organic EL element (organic electroluminescent element)
80 Organic EL display device (organic electroluminescent display device)
81 Bank member
82 Vapor-deposited layer
83 Vapor-deposited layer
84 Film thickness adjustment layer
90 Organic EL display device (organic electroluminescent display device)
91 Vapor-deposited layer
92 Film thickness adjustment layer

The invention claimed is:

1. An organic electroluminescent element, comprising:
an anode;
a cathode; and
an organic layer between the anode and the cathode, wherein
the organic layer includes (i) a first layer containing at least one phosphorescent material, and (ii) a second layer containing at least one fluorescent material, at least the first layer and the second layer being adjacent to each other, an energy level in a lowest triplet excited state in the first layer being higher than an energy level in a lowest triplet excited state in the second layer,
the second layer has a thickness of not more than 1 nm,
the organic electroluminescent element emits light within at least a first wavelength range,
the light within the at least the first wavelength range includes light within the first wavelength range,
the light within the first wavelength range is emitted when an exciton in a lowest singlet excited state in the second layer changes to a ground state,
the exciton in the lowest singlet excited state in the second layer is generate as a result of (i) a triplet exciton generated in the first layer undergoing energy transfer to an exciton in a triplet excited state in the second layer, and (ii) the exciton in the triplet excited state being upconverted to an exciton in a singlet excited state among molecules in the second layer, and
the first layer and the second layer have a combined thickness of not more than 2 nm.

2. The organic electroluminescent element according to claim 1, wherein
the light within at least the first wavelength range further includes light within a second wavelength range,
the light within the second wavelength range is emitted when an exciton in a lowest triplet excited state in the first layer changes to the ground state,
the exciton in the lowest triplet excited state in the first layer is a triplet exciton generated in the first layer, and the triplet exciton generated in the first layer does not undergo the energy transfer to an exciton in the triplet excited state in the second layer.

3. The organic electroluminescent element according to claim 1, wherein an energy level in the lowest singlet excited state in the second layer is higher than an energy level in a lowest singlet excited state in the first layer.

4. The organic electroluminescent element according to claim 2, wherein
a first one of the anode and the cathode is provided with a reflective layer;
a second one of the anode and the cathode is provided with a semi-transmissive reflective layer; and
the reflective layer and the semi-transmissive reflective layer are separated from each other by a distance that allows either the light within the first wavelength range or the light within the second wavelength range to be extracted outside.

5. The organic electroluminescent element according to claim 4, wherein the distance between the reflective layer and the semi-transmissive reflective layer has been adjusted by changing a thickness of a vapor-deposited film including at least the organic layer.

6. The organic electroluminescent element according to claim 1, wherein the fluorescent material is a fluorescent material that emits light within a blue range.

7. The organic electroluminescent element according to claim 1, wherein the phosphorescent material is a phosphorescent material that emits light within a red range or light within a green range.

8. The organic electroluminescent element according to claim 1, wherein
the anode and the organic layer are separated from each other by a hole transfer layer;
the cathode and the organic layer are separated from each other by an electron transfer layer;
the second layer is closer to the hole transfer layer than to the first layer; and
the hole transfer layer has a positive hole mobility higher than an electron mobility of the electron transfer layer.

9. The organic electroluminescent element according to claim 1, wherein
the anode and the organic layer are separated from each other by a hole transfer layer;
the cathode and the organic layer are separated from each other by an electron transfer layer;
the second layer is closer to the electron transfer layer than to the first layer; and
the electron transfer layer has an electron mobility higher than a positive hole mobility of the hole transfer layer.

10. The organic electroluminescent element according to claim 1, wherein
the organic layer further includes a third layer containing at least one fluorescent material;
the third layer is adjacent to the first layer and is present on a first side of the first layer, the first side of the first layer is opposite to a second side of the first layer, and the second layer is present on the second side of the first layer;
an energy level in a lowest triplet excited state in the third layer is lower than the energy level in the lowest triplet excited state in the first layer and is different from the energy level in the lowest triplet excited state in the second layer;
an energy level in a lowest singlet excited state in the third layer is higher than an energy level in a lowest singlet excited state in the first layer and is different from an energy level in the lowest singlet excited state in the second layer;
the third layer has a thickness of not more than 1 nm; and
the organic electroluminescent element emits the light within at least the first wavelength range, the light within at least the first wavelength range includes:
the light within the first wavelength range, the light within the first wavelength range being emitted when the exciton in the lowest singlet excited state in the second layer changes to the ground state, the exciton in the lowest singlet excited state in the second layer being generated as a result of (i) the triplet exciton generated in the first layer undergoing energy transfer to an exciton in a lowest triplet excited state in the second layer and (ii) the exciton in the lowest triplet excited state being upconverted to an exciton in a lowest singlet excited state among the molecules in the second layer changes;
light within a third wavelength range, the light within the third wavelength range being emitted when an exciton in the lowest singlet excited state in the third layer changes to the ground state, the exciton in the lowest singlet excited state in the third layer being generated as a result of (i) the triplet exciton generated in the first layer undergoing energy transfer to an exciton in the lowest triplet excited state in the third layer and (ii) the exciton in the lowest triplet excited state being upconverted to an exciton in a lowest singlet excited state among molecules in the third layer changes; and
light within a second wavelength range, the light within the second wavelength range being emitted when an exciton in a lowest triplet excited state in the first layer changes to the ground state, the exciton in a lowest triplet excited state in the first layer being a triplet exciton generated in the first layer, the triplet exciton generated in the first layer not undergoing the energy transfer to an exciton in the lowest triplet excited state in the second layer,
the first wavelength range is a shorter wavelength range than the third wavelength range, and
the third wavelength range is a shorter wavelength range than the second wavelength range.

11. The organic electroluminescent element according to claim 10, wherein
a first one of the anode and the cathode is provided with a reflective layer;
a second one of the anode and the cathode is provided with a semi-transmissive reflective layer; and
the reflective layer and the semi-transmissive reflective layer are separated from each other by a distance that allows one of the light within the first wavelength range, the light within the second wavelength range, and the light within the third wavelength range to be extracted outside.

12. An organic electroluminescent display device, comprising:
the organic electroluminescent element according to claim 1.

13. The organic electroluminescent element according to claim 1, wherein
the organic layer further includes a fourth layer containing a phosphorescent material, and
the second layer is sandwiched between the first layer and the fourth layer.

14. The organic electroluminescent element according to claim 13, wherein the second layer and the fourth layer have a combined thickness of not more than 2 nm.

15. The organic electroluminescent element according to claim 1, wherein
the organic layer further includes a third layer containing a phosphorescent material, and
the first layer is sandwiched between the second layer and the third layer.

16. The organic electroluminescent display device according to claim 12, wherein the organic electroluminescent element further comprises:
a first organic electroluminescent element that emits blue light;
a second organic electroluminescent element that emits green light; and
a third organic electroluminescent element that emits red light, wherein
the first organic electroluminescent element that emits blue light, the second organic electroluminescent element that emits green light, and the third organic electroluminescent element that emits red light each include the first layer as a common layer and the second layer as a common layer.

17. An organic electroluminescent element, comprising:
an anode;
a cathode; and
an organic layer between the anode and the cathode, wherein
the organic layer includes (i) a first layer containing at least one phosphorescent material and (ii) a second layer containing at least one fluorescent material, at least the first layer and the second layer being adjacent to each other, an energy level in a lowest triplet excited state in the first layer being higher than an energy level in a lowest triplet excited state in the second layer,
the second layer has a thickness of not more than 1 nm,
the organic electroluminescent element emits light within at least a first wavelength range,
the light within the at least the first wavelength range includes light within the first wavelength range,
the light within the first wavelength range is emitted when an exciton in a lowest singlet excited state in the second layer changes to a ground state,
the exciton in the lowest singlet excited state in the second layer is generated as a result of (i) a triplet exciton generated in the first layer undergoing energy transfer to an exciton in a triplet excited state in the second layer, and (ii) the exciton in the triplet excited state being upconverted to an exciton in a singlet excited state among molecules in the second layer,
the organic layer further includes a third layer containing at least one fluorescent material,
the third layer being adjacent to the first layer and being present on a first side of the first layer, the first side of the first layer being opposite to a second side of the first layer, the second layer being present on the second side of the first layer,
an energy level in a lowest triplet excited state in the third layer is lower than the energy level in the lowest triplet excited state in the first layer and being different from the energy level in the lowest triplet excited state in the second layer,
the energy level in the lowest singlet excited state in the third layer is higher than an energy level in a lowest singlet excited state in the first layer and being different from an energy level in the lowest singlet excited state in the second layer,
the third layer has a thickness of not more than 1 nm; and
the organic electroluminescent element being configured to emit the light within at least the first wavelength range, the light within at least the first wavelength range including:
the light within the first wavelength range, the light within the first wavelength range being emitted when the exciton in the lowest singlet excited state in the second layer changes to the ground state, the exciton in the lowest singlet excited state in the second layer being generated as a result of (i) the triplet exciton generated in the first layer undergoing energy transfer to an exciton in the lowest triplet excited state in the second layer and (ii) the exciton in the lowest triplet excited state being upconverted to an exciton in a lowest singlet excited state among the molecules in the second layer,
light within a third wavelength range is emitted when an exciton in the lowest singlet excited state in the third layer changes to the ground state,
the exciton in the lowest singlet excited state in the third layer being generated as a result of (i) the triplet exciton generated in the first layer undergoing energy transfer to an exciton in the lowest triplet excited state in the third layer and (ii) the exciton in the lowest triplet excited state being upconverted to an exciton in a lowest singlet excited state among molecules in the third layer,
light within a second wavelength range is emitted when an exciton in the lowest triplet excited state in the first layer changes to a ground state, the exciton in the lowest triplet excited state in the first layer being a triplet exciton generated in the first layer, the triplet exciton generated in the first layer not undergoing the energy transfer to an exciton in the lowest triplet excited state in the second layer,
the first wavelength range is a shorter wavelength range than the third wavelength range, and
the third wavelength range is a shorter wavelength range than the second wavelength range.

18. The organic electroluminescent element according to claim 17, wherein
a first one of the anode and the cathode is provided with a reflective layer,
a second one of the anode and the cathode is provided with a semi-transmissive reflective layer, and
the reflective layer and the semi-transmissive reflective layer are separated from each other by a distance that allows one of the light within the first wavelength range, the light within the second wavelength range, and the light within the third wavelength range to be extracted outside.

19. An organic electroluminescent display device, comprising:
the organic electroluminescent element according to claim 18.

20. The organic electroluminescent display device according to claim 19, wherein the organic electroluminescent element further comprises:
a first organic electroluminescent element that emits blue light;
a second organic electroluminescent element that emits green light; and
a third organic electroluminescent element that emits red light, wherein the first organic electroluminescent element that emits blue light, the second organic electroluminescent element that emits green light, and the third organic electroluminescent element that emits red light each include the first layer as a common layer and the second layer as a common layer.

* * * * *